(12) United States Patent
Hase et al.

(10) Patent No.: US 8,953,286 B2
(45) Date of Patent: Feb. 10, 2015

(54) MAGNETORESISTIVE ELEMENT WITH ALUMINUM OR IRON CONCENTRATION RATIO CHANGED IN FILM-THICKNESS DIRECTION

(71) Applicant: Kabushiki Kaisha Toshiba, Tokyo (JP)

(72) Inventors: Naoki Hase, Tokyo (JP); Masayuki Takagishi, Tokyo (JP); Susumu Hashimoto, Tokyo (JP); Shuichi Murakami, Tokyo (JP); Yousuke Isowaki, Yokohama (JP); Masaki Kado, Kamakura (JP); Hitoshi Iwasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/193,172

(22) Filed: Feb. 28, 2014

(65) Prior Publication Data

US 2014/0334029 A1    Nov. 13, 2014

(30) Foreign Application Priority Data

May 9, 2013   (JP) ................................ 2013-099348

(51) Int. Cl.
*G11B 5/39* (2006.01)
*G11B 5/31* (2006.01)

(52) U.S. Cl.
CPC ...................................... *G11B 5/315* (2013.01)
USPC ................. 360/324.12; 360/324.11

(58) Field of Classification Search
CPC ........................................ G11B 5/39–5/3993
USPC .................................................. 360/313–328
See application file for complete search history.

(56) References Cited

U.S. PATENT DOCUMENTS 7,499,249 B2   3/2009 Ide et al.
8,582,249 B2   11/2013 Sapozhnikov et al.
(Continued)

FOREIGN PATENT DOCUMENTS

| JP | 2006-310620 | 11/2006 |
| JP | 2012-190914 | 10/2012 |
| JP | 2012-230750 | 11/2012 |

OTHER PUBLICATIONS

Office Action mailed Jul. 8, 2014 in counterpart Japanese Patent Application No. 2013-099348 and English-language translation thereof.
Kubota et al., "Half-metallicity and Gilbert damping constant in $Co_2Fe_xMn_{1-x}Si$ Heusler alloys depending on the film composition", *Applied Physics Letters*, 94, 122504, 2009, 3 pgs.

*Primary Examiner* — Craig A. Renner
(74) *Attorney, Agent, or Firm* — Nixon & Vanderhye, P.C.

(57) ABSTRACT

A magnetoresistive element according to an embodiment includes: a magnetoresistance effect film including: a first and second magnetic films; and an intermediate film disposed between the first and second magnetic films, at least one of the first and second magnetic films being formed of a Heusler alloy expressed as $Co_{100-x}(A_yB_{1.0-y})_x$ (40 at %≤x≤60 at %, 0.3≤y≤0.7) where A is an alloy containing at least Fe and Mn, and B is an alloy containing at least Si, Al, and Ge, a composition of the at least one of the first and second magnetic films being changed in a film-thickness direction so that a ratio of Fe/(Fe+Mn) is less than 60% in a first region disposed near an interface with the intermediate film in the film-thickness direction, and is 60% or more in a second region that is disposed at more distance from the interface than the first region in the film-thickness direction.

12 Claims, 7 Drawing Sheets

(56) References Cited

U.S. PATENT DOCUMENTS

2006/0227467 A1* 10/2006 Ide et al. ............... 360/324.11
2006/0262460 A1* 11/2006 Ide et al. ............... 360/324.12
2007/0086121 A1   4/2007 Nagase et al.

* cited by examiner

MAGNETORESISTIVE ELEMENT WITH ALUMINUM OR IRON CONCENTRATION RATIO CHANGED IN FILM-THICKNESS DIRECTION

CROSS REFERENCE TO RELATED APPLICATIONS

This application is based upon and claims the benefit of priority from prior Japanese Patent Application No. 2013-099348 filed on May 9, 2013 in Japan, the entire contents of which are incorporated herein by reference.

FIELD

Embodiments described herein relate generally to magnetoresistive elements, magnetic heads, and magnetic recording and reproducing apparatuses.

BACKGROUND

In a magnetic recording and reproducing apparatus, data stored in a magnetic recording medium such as a hard disk drive is read by a magnetoresistive magnetic head. As the recording density improves, high-sensitivity reproduction of data is required. In order to achieve this, a reproduction sensor having a high MR ratio (resistance change ratio) and a high current density is needed.

DETAILED DESCRIPTION

Figure 1:
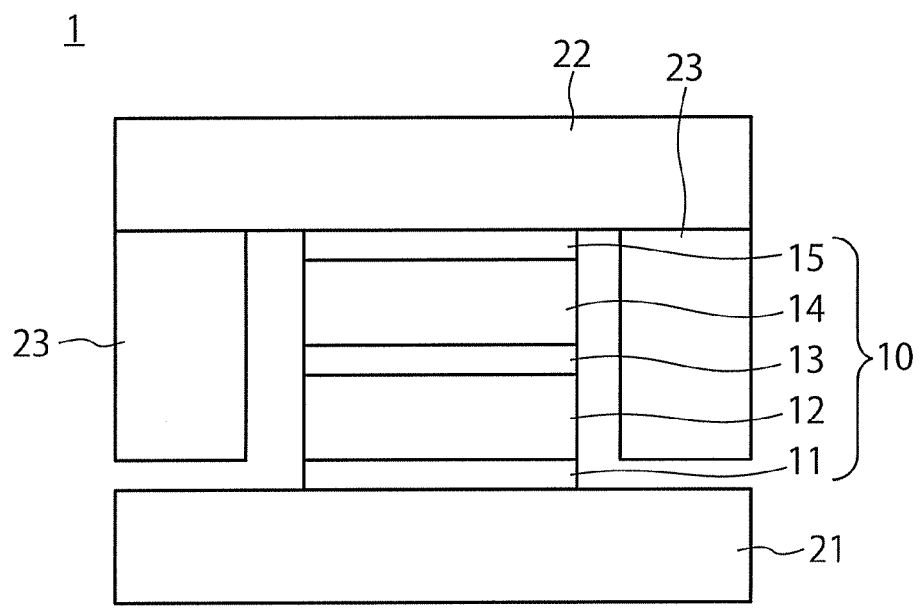
FIG. 1 is a plan view showing a reproducing unit of a magnetic head according to the first embodiment.

A magnetoresistive element according to an embodiment includes: a magnetoresistance effect film including: a first magnetic film; a second magnetic film; and an intermediate film of a nonmagnetic material disposed between the first magnetic film and the second magnetic film, at least one of the first magnetic film and the second magnetic film being formed of a Heusler alloy expressed as $Co_{100-x}(A_yB_{1.0-y})_x$ (40 at %≤x≤60 at %, 0.3≤y≤0.7) where A is an alloy containing at least Fe and Mn, and B is an alloy containing at least Si, Al, and Ge, a composition of the at least one of the first magnetic film and the second magnetic film being changed in a film-thickness direction so that a ratio of Fe/(Fe+Mn) is less than 60% in a first region disposed near an interface with the intermediate film in the film-thickness direction, and is 60% or more in a second region that is disposed at more distance from the interface than the first region in the film-thickness direction.

Embodiments will now be explained with reference to the accompanying drawings.

It should be noted that the drawings are schematic and conceptional, and the relationship between the thickness and the width of each part, and the ratio in size between the parts do not necessarily match the actual ones. Furthermore, the same parts may be expressed with different sizes and ratios in different drawings.

It should also be noted that explanation of an element that has already been described with reference to a drawing and has the same reference numerals as those in the drawing may be arbitrarily omitted.

First Embodiment

A magnetic head according to the first embodiment will be described with reference to FIG. 1. The magnetic head according to the first embodiment includes a reproducing unit, which is shown in FIG. 1. FIG. 1 is a plan view of the reproducing unit 1 viewed from a magnetic recording medium, i.e. from an air bearing surface (hereinafter also referred to as the "ABS"). In FIG. 1, a direction from the reproducing unit 1 to a magnetic recording medium that is not shown is denoted by an "x direction," a track width direction of the magnetic recording medium is denoted by a "y direction," and a track length direction of the magnetic recording medium is denoted by a "z direction." The reproducing unit 1 includes a magnetoresistive film (hereinafter also referred to as the "MR film") 10 having a multilayer structure of magnetic materials with a magnetoresistance effect, and layers of magnetic shields 21, 22 disposed on both sides of the MR film 10. The MR film 10 has a structure obtained by stacking a base layer 11, a magnetic layer 12, intermediate layer 13 of a nonmagnetic material, a magnetic layer 14, and a cap layer 15 in this order. The magnetic shields 21, 22 also serves as electrodes for passing a current through the MR film 10. Thus, the reproducing unit 1 functions as a magnetoresistive element. In the first embodiment, side shields 23 are disposed on end portions in the track width direction (y direction) of the MR film 10 via insulating layers that are not shown.

In the reproducing unit 1 of the first embodiment, both the magnetic layers 12, 14 serve as free layers to detect a magnetic field from the magnetic recording medium. Specifically, in response to the magnetic field from the magnetic recording medium, an angle formed by the magnetization direction of the magnetic layer 12 and the magnetization direction of the magnetic layer 14 changes, which changes the electric resistance of the reproducing unit 1. The change in the electric resistance is detected by passing a constant current between the magnetic shields 21 and 22 and measuring a voltage therebetween, or applying a constant voltage between the magnetic shields 21 and 22, and measuring the current flowing therebetween.

The base layer 11 is formed of a nonmagnetic metal such as Ta, Ru, and Cu. The base layer 11 can also be formed of layers of a plurality of materials, such as Ta/Cu and Ta/Ru.

The magnetic layers 12, 14 are formed of a Heusler ordered alloy with a composition $Co_{100-x}(A_yB_{1.0-y})_x$ (40 at %≤x≤60 at %, 0.3≤y≤0.7) where A is an alloy containing at least Fe and Mn, and B is an alloy containing at least Si, Al, and Ge. The alloy composition changes in the film-thickness direction. In the first embodiment, the ratio of Fe/(Fe+Mn) in a region near the interfaces between the magnetic layers 12, 14 and the intermediate layer 13 is less than 60%, and the ratio of Fe/(Fe+Mn) in a region at a distance from the interface with the intermediate layer 13 is 60% or more. At least a part of Fe and Mn can be substituted by Cr. Also in this case, the aforementioned composition ratios are preferably maintained in consideration of Cr that is substituted. Furthermore, the concentration of Fe preferably increases gradually as a distance in the magnetic layers 12, 14 increases from the interface with the intermediate layer 13.

The alloy composition of the magnetic layers 12, 14 can also change such that the ratio of Al/(Si+Ge+Al) in a region near the intermediate layer 13 is 40% or less, and in a region at a distance from the interface is 40% or more. At least a part Ge and Al can be substituted by Ga. In such a case, the aforementioned ratios are preferably maintained in consideration of Ga that is substituted. Furthermore, the concentration of Al preferably increases gradually as a distance in the magnetic layers 12, 14 increases from the interface with the intermediate layer 13.

The thickness of the magnetic layers 12, 14 is preferably from 3 to 8 nm. If a high-resolution reproduction is needed, the thickness is preferably decreased to decrease the distance (gap length) between the magnetic shield 21 and the magnetic shield 22. For example, if the base layer 11 has a multilayer structure including a Ta layer having a thickness of 2 nm and a Cu layer having a thickness of 1 nm, the intermediate layer 13 is formed of Cu having a thickness of 2 nm, and the cap layer 15 has a multilayer structure including a Cu layer having a thickness of 1 nm and a Ta layer having a thickness of 2 nm, a narrow gap length of 16 nm can be achieved by setting the thickness of the magnetic layers 12, 14 to be 4 nm. Thus, high-resolution reproduction needed for reproducing data with a recording density 2 Tb/in$^2$ to 4 Tb/in$^2$ is enabled.

If the thickness of the magnetic layers 12, 14 is reduced to less than 3 nm, a reduction in the magnetoresistance change ratio (MR ratio) and an increase in magnetic noise caused by thermal fluctuation become considerable, which makes it difficult to reproduce data with a high signal-to-noise ratio. If the thickness of the magnetic layers 12, 14 exceeds 8 nm, the gap length becomes about the same as that of conventional reproducing heads, 24 nm. However, this is beyond the gap length required for a reproducing head for a high recording density medium, 2 Tb/in$^2$ to 4 Tb/in$^2$.

The intermediate layer 13 of a nonmagnetic material can be formed of a metal film of Cu or Ag, an oxide film of MgO, GaO, or ZnO, an insulating film having a fine conductive region containing a magnetic metal (such as Fe or Co) or a nonmagnetic metal (such as Cu), or a thin film of a nitride such as TiN, CrN, or TaN.

The cap layer 15 can be formed of a nonmagnetic metal such as Ta, Ru, Cu, Ag, Au, Al, or Ti.

The layers of magnetic shields 21, 22 can be formed of, for example, a NiFe alloy. The layers of magnetic shields 21, 22 also have a function as electrodes for passing a current through the MR film 10, in addition to a function of improving resolution.

Figure 2:
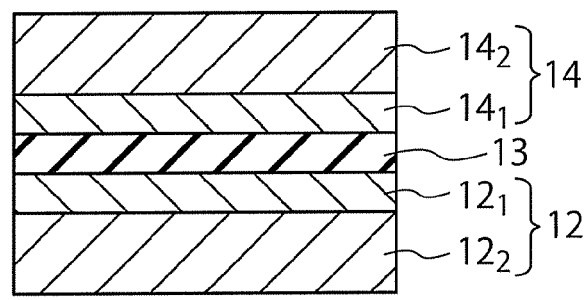
FIG. 2 is a cross-sectional view showing the structure of magnetic layers of the reproducing unit.

Next, the structure of the magnetic layers 12, 14 will be described in more detail. FIG. 2 shows a first specific example of the detailed structure of the magnetic layers 12, 14. The magnetic layer 12 has a multilayer structure including a magnetic layer $12_1$ and a magnetic layer $12_2$, and the magnetic layer 14 has a multilayer structure including a magnetic layer $14_1$ and a magnetic layer $14_2$. The magnetic layers $12_1$ and $14_1$, which are in contact with the intermediate layer 13, are formed of $Co_{50}(Fe_{0.4}Mn_{0.6})_{25}Si_{25}$ having a thickness of 2 nm. The expression $(Fe_{0.4}Mn_{0.6})_{25}$ means that the concentration of Fe is 10 at % (=0.4×25 at %), and the concentration of Mn is 15 at % (=0.6×25 at %). The magnetic layers $12_2$, $14_2$ are formed of $Co_{50}(FeMn)_{25}Si_{25}$, in which the composition ratio of Fe and Mn is changed, having a thickness of 4 nm. If these layers are heat-treated at a temperature of 300° C., interdiffusion occurs at the interface between the magnetic layers $12_1$ and $12_2$, and the interface between the magnetic layers $14_1$ and $14_2$, but the region in which the ratio of Fe/(Fe+Mn) is less than 50% is maintained near the interface with the intermediate layer, and the region in which the ratio of Fe/(Fe+Mn) is the same as that immediately after the deposition is maintained a distance from the intermediate layer.

Figure 3:
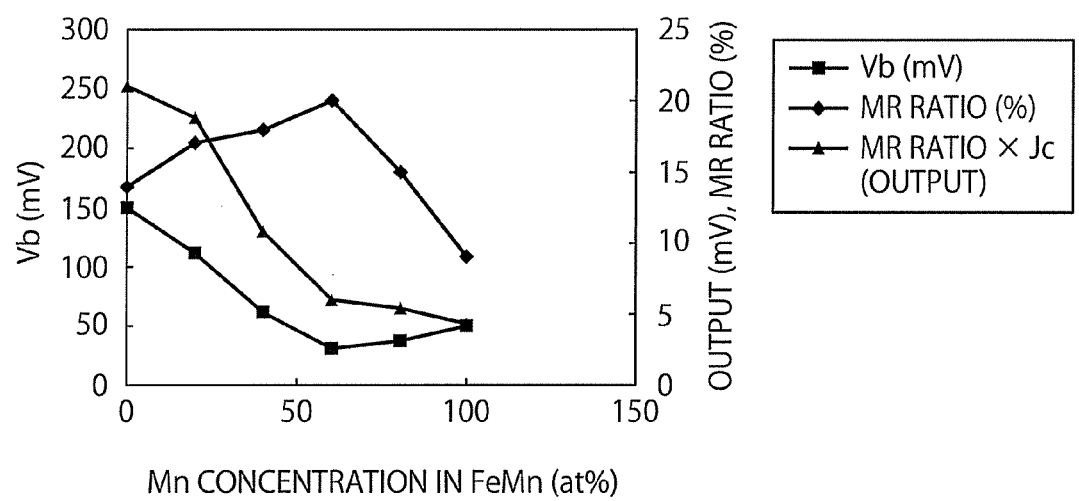
FIG. 3 is a diagram showing the dependence of a magnetic layer relating to the MR characteristics of the reproducing unit on the FeMn composition ratio.
Figure 4:
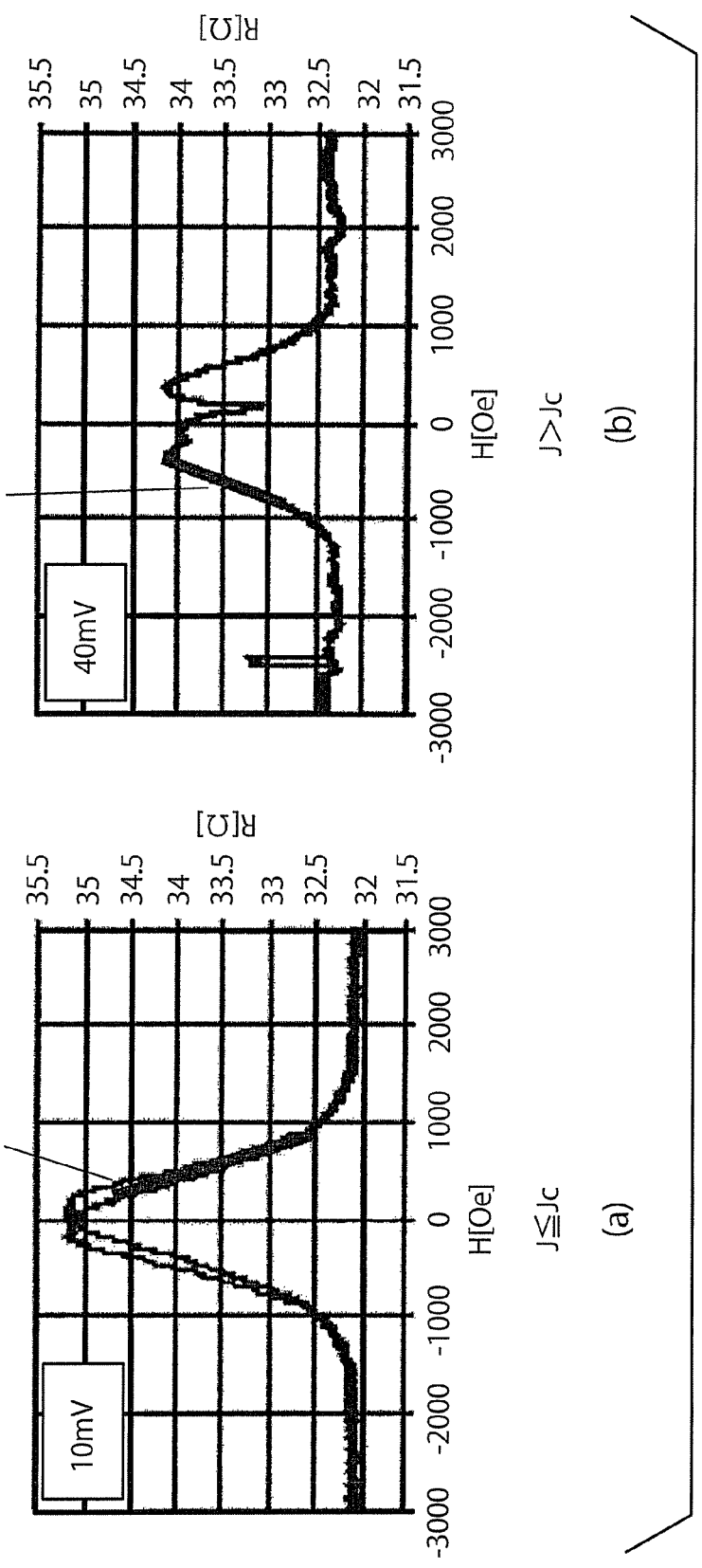
FIGS. 4(a) and 4(b) are diagrams for explaining critical current density.

Samples of MR film in which the ratio Fe/(Fe+Mn) in the magnetic layers $12_2$, $14_2$ is set to be 100%, 80%, 60%, 40%, 20%, and 0%, are prepared. After being heat-treated at a temperature of 300° C., the MR films are patterned to have a size of 50 nm×100 nm to form an MR element with a lower electrode and an upper electrode. The MR ratio and the obtainable maximum current density Jc of these MR elements are studied. FIG. 3 shows the MR ratio, the voltage Vb, and the expectable reproduction output V (MR ratio×Jc). The voltage Vb is generated between the electrodes of each MR element when the current with the obtainable maximum current density Jc is caused to flow between the electrodes of each MR element. In FIG. 3, the horizontal axis shows the ratio of Mn/(Fe+Mn). The obtainable maximum current density Jc is a current density at which the shape of an R-H curve indicating the magnetoresistance effect is not deformed, as shown in FIGS. 4(a) and 4(b). When the current density J exceeds the critical value Jc, the spin transfer torque noise becomes considerable to disturb the magnetization direction, which narrows the linear response range, and reduces the reproduction output as a result.

Figure 5:
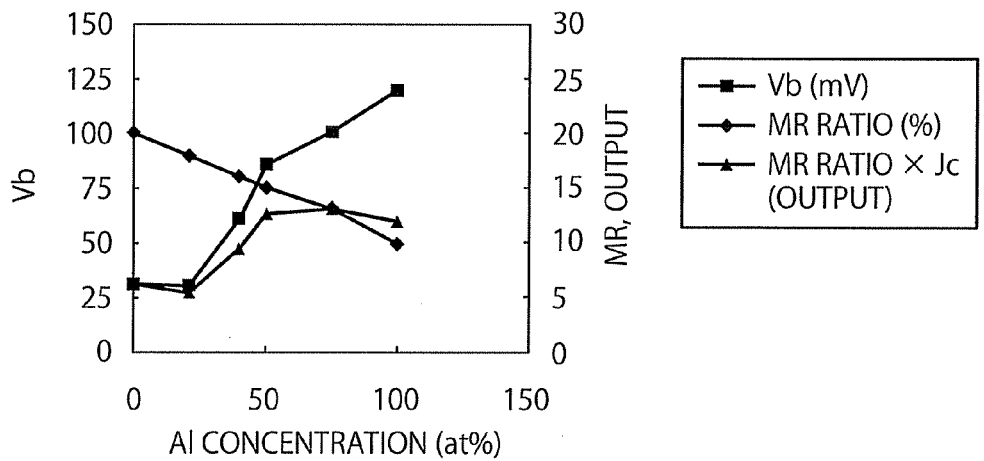
FIG. 5 is a diagram showing the MR characteristics in a case where a part or the whole of Si in a CoFeMnSi film is replaced with Al.

The reproduction output V of a magnetic head including the aforementioned MR element is, in principle, proportional to a product of the MR ratio and Jc. Accordingly, an MR element in which such a product is large is needed for high-sensitivity reproduction. MR elements in which a part of Si in the CoFeMnSi film of the aforementioned MR element is substituted by Al with the concentration of Al being 0 at %, 20 at %, 40 at %, 50 at %, 80 at %, 100 at % are formed, and the MR ratio and the obtainable maximum current density Jc of each MR element is studied. FIG. 5 shows the MR ratio and the voltage Vb, and the expectable reproduction output V (MR ratio×Jc) of the MR elements. As can be understood from FIG. 5, when the Al concentration becomes 40% or more, the MR ratio slightly decreases but the obtainable maximum current density Jc increases to increase the reproduction output V. The reason why the obtainable maximum current density Jc increases is considered to be that the Fe-rich region has a large Gilbert damping constant, thereby suppressing the generation of spin transfer torque noise. It is disclosed in, for example, Applied Physics Letters, Volume 94, page 122504 (2009) that the Fe-rich region has the large Gilbert damping constant.

As a comparative example, an MR element in which the magnetic layers 12, 14 are each formed of a single CoFeSi layer is prepared. However, although the obtainable maximum current density Jc increases, the MR ratio considerably decreases therein.

From the foregoing, it is understood that a high MR ratio and a high Jc can be obtained if the magnetic layers 12, 14 have a multilayer structure.

Although the magnetic layers 12, 14 each have a multilayer structure including two layers in FIG. 2, a multilayer structure including three layers or more can also be employed. In such a case, the Fe concentration can be gradually increased from the intermediate layer 13. The same effect can be obtained if Si is substituted by Ge. Furthermore, the same effect can be obtained if a part of the element of the A site is substituted by Cr. Moreover, the same effect can also be obtained if a part of the element of the B site is substituted by Ga.

Next, a second specific example of the magnetic layers 12, 14 of the first embodiment will be described. The magnetic layers $12_1$, $14_1$ of the second specific example are formed of a $Co_{50}(Fe_{0.4}Mn_{0.6})_{25}Si_{25}$ alloy. The magnetic layers $12_2$, $14_2$ are formed of a CoFeMnAlSi alloy in which a part of Si of the above alloy is substituted by Al, having a thickness of 0.5 nm. FIG. 5 shows the relationship among the Al/(Si+Al) ratio, the MR ratio, the obtainable maximum current density Jc, and the reproduction output V of the magnetic layers $12_2$, $14_2$. It can be found that the output improves when the Al concentration is 40% or more.

As described above, according to the first embodiment, a magnetoresistive element and a magnetic head having a high MR ratio and capable of supplying a high current density can be provided.

Second Embodiment

Figure 6:
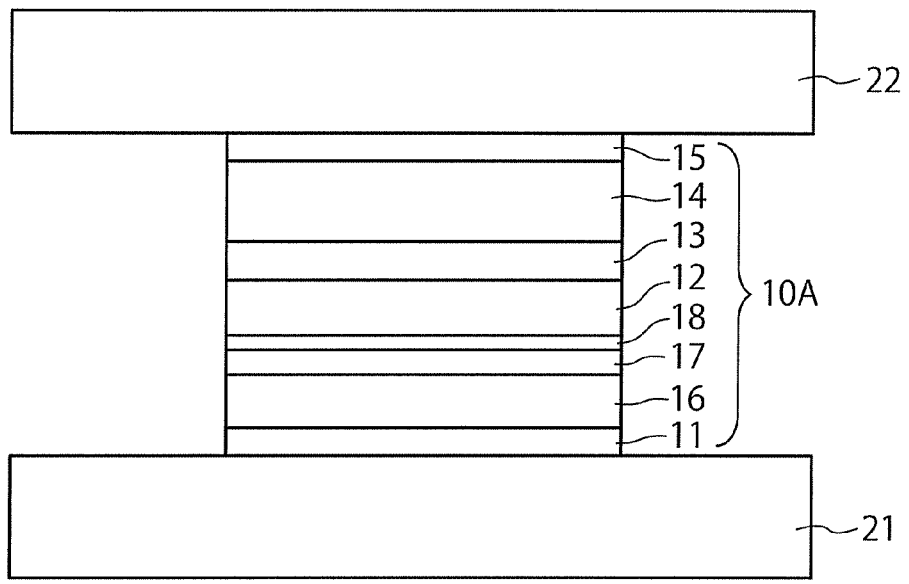
FIG. 6 is a plan view showing a reproducing unit of a magnetic head according to the second embodiment.

A magnetic head according to the second embodiment will be described with reference to FIG. 6. The magnetic head 30 according to the second embodiment includes a reproducing unit, which is shown in FIG. 6. FIG. 6 is a plan view in which the reproducing unit 1A is viewed from an air bearing surface. The reproducing unit 1A has a structure in which the MR film 10 of the reproducing unit 1 according to the first embodiment shown in FIG. 1 is replaced with an MR film 10A. The MR film 10A includes an antiferromagnetic layer 16, a magnetic layer 17, and an exchange coupling layer 18 between the base layer 11 and the magnetic layer 12 of the MR film 10. The magnetization direction of the magnetic layer 17 is fixed in one direction by the antiferromagnetic layer 16. The magnetic layer 12 and the magnetic layer 17 are exchange-coupled by the exchange coupling layer 18.

The base layer 11, the nonmagnetic intermediate layer 13, and the cap layer 15 are formed of the same materials, and have the same thicknesses as those in the first embodiment.

The antiferromagnetic layer 16 is formed of, for example, an IrMn alloy having a thickness of 5 nm to 7 nm. The magnetic layer 17, in which the magnetization direction is fixed, is formed of, for example, a CoFe alloy. The exchange coupling layer 18 is formed of, for example, Ru.

At least one of the magnetic layer 12 and the magnetic layer 14 is formed of a Heusler alloy described in the descriptions of the first embodiment.

A CoFe alloy layer (not shown) having a thickness of about 0.5 nm can be disposed at the interface between the magnetic layer 12 and the exchange coupling layer 18 in order to secure satisfactory exchange coupling. The thickness of the magnetic layer 12 is preferably as thin as about 2 nm, to secure strong exchange coupling for stably fixing the magnetization and to achieve a high-resolution reproduction obtained by a short distance between the upper and the lower shields. For example, the thickness of the magnetic layers $12_1$, $12_2$ shown in FIG. 2 is set to be about 1 nm, and a Heusler alloy described in the descriptions of the first embodiment is used to form these layers.

The magnetic layer 14 of the second embodiment may have a stacked structure including, for example, a layer of a Heusler alloy having a composition similar to that of the magnetic layer 12, a diffusion barrier layer (formed of Cu, Ta, or Ru, having a thickness of a mono-layer added by 1 nm), and one of a NiFe layer and a Fe layer having a thickness of 2 nm to 4 nm stacked in this order, the one of the NiFe layer and Fe layer having a negative magnetostriction. The thickness of the mono-layer is assumed to be 0.125 nm. A Heusler alloy generally have a positive magnetostriction, but the magnetic layer 14 should have a characteristic of changing the magnetization smoothly in response to the magnetic field from a medium to have a now noise. In order to achieve this, the magnetostriction should be lowered. By disposing the NiFe layer or Fe layer having a negative magnetostriction to cancel the positive magnetostriction, a low magnetostriction can be achieved.

According to the second embodiment, a magnetoresistive element and a magnetic head having a high MR ratio and capable of supplying a high current density can be provided as in the case of the first embodiment.

Third Embodiment

Figure 7:
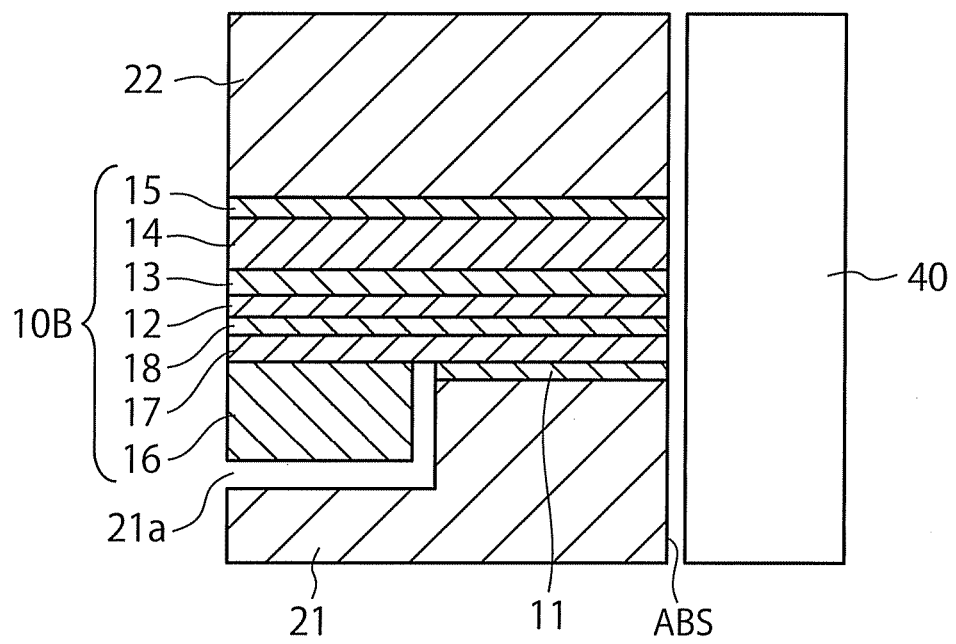
FIG. 7 is a cross-sectional view showing a reproducing unit of a magnetic head according to the third embodiment.

A magnetic head according to the third embodiment will be described with reference to FIG. 7. The magnetic head of the third embodiment includes a reproducing unit. FIG. 7 shows such a reproducing unit 1B. FIG. 7 is a cross-sectional view of the reproducing unit 1B taken along a plane perpendicular to the ABS. In FIG. 7, a direction from the reproducing unit 1B to the magnetic recording medium 40 is denoted by an "x direction," a track width direction of the magnetic recording medium 40 is denoted by a "y direction," and a track length direction of the magnetic recording medium 40 is denoted by a "z direction." The reproducing unit 1B includes a magnetoresistive (hereinafter also referred to as the "MR") film 10B having a multilayer structure of magnetic materials to have the magnetoresistance effect, and layers of magnetic shields 21, 22 disposed on both sides of the MR film 10B. The layer of magnetic shield 21 has a recessed portion 21a that is located opposite to the ABS and on the side of the MR film 10B. The recessed portion 21a is located in a region about 20 to 50 nm back from the ABS.

The MR film 10A includes a base layer 11, a magnetic layer 12, an intermediate layer 13 of a nonmagnetic material, a magnetic layer 14, a cap layer 15, an antiferromagnetic layer 16, a magnetic layer 17, and an exchange coupling layer 18. The base layer 11, the magnetic layer 17, the exchange coupling layer 18, the magnetic layer 12, the intermediate layer 13, the magnetic layer 14, and the cap layer 15 are stacked in this order on a surface of the magnetic shield 21 facing the magnetic shield 22. The base layer 11 is disposed on the surface of the magnetic shield 21 facing the magnetic shield 22 except for the region of the recessed portion 21a. The multilayer structure including the magnetic layer 17, the exchange coupling layer 18, the magnetic layer 12, the intermediate layer 13, the magnetic layer 14, and the cap layer 15 is disposed on the base layer 11 and also extends over the recessed portion 21a of the magnetic shield 21. The antiferromagnetic layer 16 is formed in the recessed portion 21a to be close to the magnetic layer 17 so as to fix the magnetization direction of the magnetic layer 17 in a uniaxial direction. An insulating film (not shown) is disposed between the antiferromagnetic layer 16 and the magnetic shield 21.

The materials of the base layer 11, the magnetic layer 17, the exchange coupling layer 18, the magnetic layer 12, the intermediate layer 13, the magnetic layer 14, the cap layer 15, and the antiferromagnetic layer 16 are the same as those of the second embodiment.

The distance between the magnetic shields 21, 22 of the reproducing unit 1B in the third embodiment can be reduced as compared to that of the reproducing unit 1A in the second embodiment. Thus, the reproducing resolution is improved.

Since the antiferromagnetic layer 16 is located at a distance from the magnetic recording medium 40, the magnetization of the magnetic layer 12 can be fixed and maintained.

According to the third embodiment, a magnetoresistive element and a magnetic head having a high MR ratio and capable of supplying a high current density can be provided, as in the case of the second embodiment.

Fourth Embodiment

A magnetic recording and reproducing apparatus according to the fourth embodiment will be described below.

The magnetic head according to any of the first to the third embodiments described above can be included in a recording and reproducing magnetic head assembly, for example, and implemented in a magnetic recording and reproducing apparatus. The magnetic recording and reproducing apparatus according to the fourth embodiment may have a reproducing function and both a recording function and a reproducing function.

Figure 8:
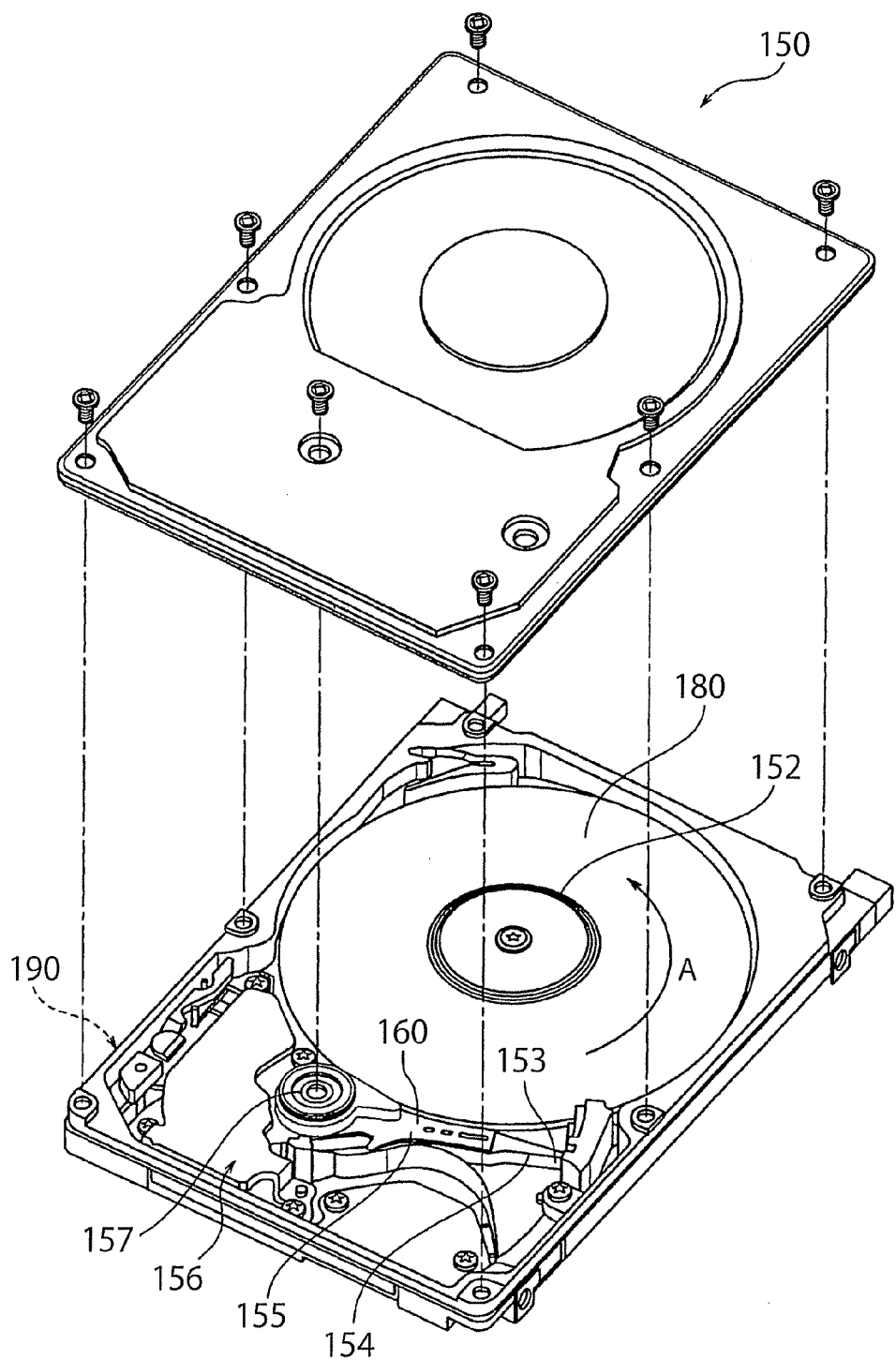
FIG. 8 is a perspective view schematically showing a magnetic recording and reproducing apparatus according to the fourth embodiment.

FIG. 8 is a schematic perspective view of a magnetic recording and reproducing apparatus according to the fourth embodiment. As shown in FIG. 8, the magnetic recording and reproducing apparatus 150 according to the fourth embodiment includes a rotary actuator. In FIG. 8, a recording medium disk 180 is set to a spindle motor 152, and rotated in the direction of the arrow A by a motor (not shown) that responds to a control signal from a drive device controller (not shown). The magnetic recording and reproducing apparatus 150 according to the fourth embodiment may have a plurality of recording medium disks 180.

A head slider 153 for recording and reproducing data stored in the recording medium disk 180 is attached to an end of a suspension 154 that is in a thin-film form. The head slider 153 has, at around the end thereof, one of the magnetic heads according to the embodiments described above with the magnetic shields, for example.

When the recording medium disk 180 is rotated, the air bearing surface (ABS) of the head slider 153 is lifted and held above the surface of the recording medium disk 180 at a certain floating distance. The head slider 153 may be of so-called "contact tracking type" that contacts the recording and reproducing medium disk 180.

The suspension 154 is connected to an end of an actuator arm 155 including such parts as a bobbin part for supporting a drive coil (not shown). The other end of the actuator arm 155 is connected to a voice coil motor 156, which is a kind of linear motor. The voice coil motor 156 may include the drive coil (not shown) wound around the bobbin part of the actuator arm 155, and a magnetic circuit including a permanent magnet and a facing yoke that are arranged at both the sides of the coil to face each other.

The actuator arm 155 is supported by ball bearings (not shown) arranged at upper and lower portions of a bearing unit 157, and can be rotated and slid freely by means of the voice coil motor 156.

Figure 9:
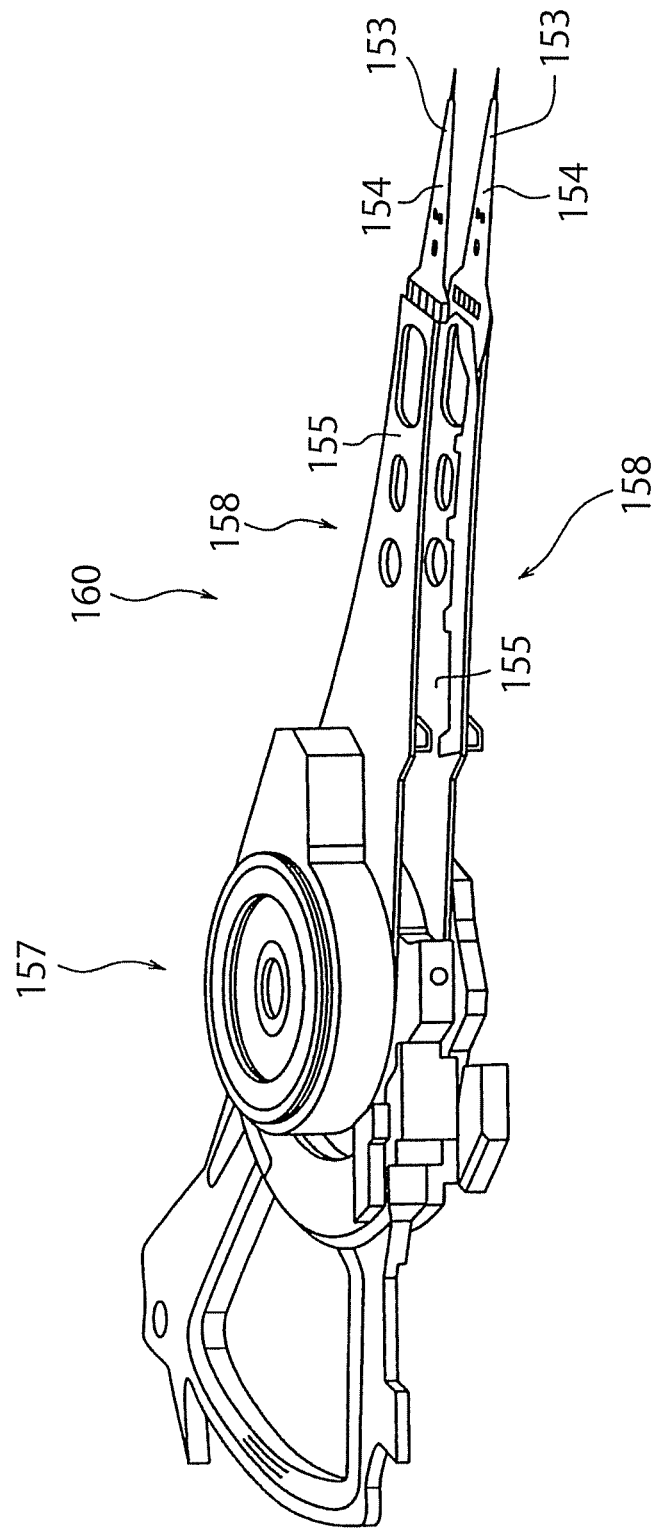
FIG. 9 is a perspective view of a head stack assembly to which a head slider is mounted.

FIG. 9 shows an example of the structure of a part of the magnetic recording and reproducing apparatus according to the fourth embodiment, and is an enlarged perspective view of a magnetic head assembly 160 from the actuator arm 155 to the end, viewed from the disk side. As shown in FIG. 9, the magnetic head assembly 160 includes the bearing unit 157, a head gimbal assembly (hereinafter referred to as the "HGA") 158 extending from the bearing unit 157, and a support frame that supports the coil of the voice coil motor and extends from the bearing unit 157 to a direction opposite to the direction of the HGA. The HGA includes the actuator arm 155 extending from the bearing unit 157, and the suspension 154 extending from the actuator arm 155.

The head slider 153 including the magnetic head according to any of the first to the third embodiments is attached to the tip of the suspension 154.

Thus, the magnetic head assembly 160 according to the fourth embodiment includes the magnetic head according to any of the first to the third embodiments, the suspension 154 for holding the magnetic head at one end thereof, and the actuator arm 155 attached to the other end of the suspension 154.

The suspension 154 includes a lead line (not shown) for writing and reading signals, which is electrically connected to respective electrodes of the magnetic recording head attached to the head slider 153. The magnetic head assembly 160 also includes an electrode pad that is not shown.

The magnetic head assembly 160 further includes a signal processing unit 190 for writing signals to and reading signals from a magnetic recording medium using the magnetic recording head. The signal processing unit 190 is, for example, attached to the back side of the magnetic recording and reproducing apparatus 150 shown in FIG. 8. Input and output lines of the signal processing unit 190 are connected to the electrode pad, and electrically coupled to the magnetic recording head.

Thus, the magnetic recording and reproducing apparatus 150 according to the fourth embodiment includes a magnetic recording medium, a magnetic head according to any of the first to the third embodiments, a movable unit (movement controller) for keeping the positions of the magnetic recording medium and the magnetic head to face each other in a separating or contacting state, and causing them to move relative to each other, a position controller for adjusting the position of the magnetic head to a predetermined recording position on the magnetic recording medium, and a signal processing unit for writing signals to and reading signals from the magnetic recording medium by means of the magnetic head. The recording medium disk 180 is used as the aforementioned magnetic recording medium. The movable unit may include the head slider 153. The position controller may include the magnetic head assembly 160.

When the magnetic disk (the recording medium disk) 180 is rotated, and the voice coil motor 156 is caused to rotate the actuator arm 155 to load the head slider 153 above the magnetic disk 180, the air bearing surface (ABS) of the head slider 153 attached to the magnetic head is supported above the surface of the magnetic disk 180 at a predetermined distance therefrom. In this manner, the data stored in the magnetic disk 180 can be read based on the aforementioned principle.

As described above, according to the fourth embodiment, a magnetic recording and reproducing apparatus having a high MR ratio and capable of supplying a high current density can be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A magnetoresistive element comprising:
   a magnetoresistance effect film including:
      a first magnetic film;
      a second magnetic film; and
      an intermediate film of a nonmagnetic material disposed between the first magnetic film and the second magnetic film,
   at least one of the first magnetic film and the second magnetic film being formed of a Heusler alloy expressed as $Co_{100-x}(A_yB_{1.0-y})_x$ (40 at %$\leq x \leq$60 at %, 0.3$\leq y \leq$0.7) where A is an alloy containing at least Fe and Mn, and B is an alloy containing at least Si, Al, and Ge,
   a composition of the at least one of the first magnetic film and the second magnetic film being changed in a film-thickness direction so that a ratio of Fe/(Fe+Mn) is less than 60% in a first region disposed near an interface with the intermediate film in the film-thickness direction, and is 60% or more in a second region that is disposed at more distance from the interface than the first region in the film-thickness direction.

2. The magnetoresistive element according to claim 1, wherein a concentration of Fe increases as a distance from the interface increases in the second region of the at least one of the first magnetic film and the second magnetic film.

3. A magnetoresistive element comprising:
   a magnetoresistance effect film including:
      a first magnetic film;
      a second magnetic film; and
      an intermediate film of a nonmagnetic material disposed between the first magnetic film and the second magnetic film,
   at least one of the first magnetic film and the second magnetic film being formed of a Heusler alloy expressed as $Co_{100-x}(A_yB_{1.0-y})_x$ (40 at %$\leq x \leq$60 at %, 0.3$\leq y \leq$0.7) where A is an alloy containing at least Fe and Mn, and B is an alloy containing at least Si, Al, and Ge,
   a composition of the at least one of the first magnetic film and the second magnetic film being changed in a film-thickness direction so that a ratio of Al/(Si+Ge+Al) is less than 40% in a first region disposed near an interface with the intermediate film in the film-thickness direction, and is 40% or more in a second region that is disposed at more distance from the interface than the first region in the film-thickness direction.

4. The magnetoresistive element according to claim 3, wherein a concentration of Al increases as a distance from the interface increases in the second region of the at least one of the first magnetic film and the second magnetic film.

5. A magnetic head comprising:
   a first magnetic shield and a second magnetic shield facing each other; and
   the magnetoresistive element according to claim 1 disposed between the first magnetic shield and the second magnetic shield.

6. The magnetic head according to claim 5, further comprising an antiferromagnetic film disposed between the first magnetic shield and the second magnetic shield, the antiferromagnetic film fixing magnetization of the other of the first magnetic film and the second magnetic film.

7. The magnetic head according to claim 6, wherein:
   the magnetoresistance effect film extends in a direction from the first magnetic shield to the second magnetic shield; and
   the antiferromagnetic film is disposed near a portion in which the other of the first magnetic film and the second magnetic film extends.

8. A magnetic head comprising:
   a first magnetic shield and a second magnetic shield facing each other; and
   the magnetoresistive element according to claim 3 disposed between the first magnetic shield and the second magnetic shield.

9. A magnetic head according to claim 8, further comprising an antiferromagnetic film disposed between the first magnetic shield and the second magnetic shield, the antiferromagnetic film fixing magnetization of the other of the first magnetic film and the second magnetic film.

10. A magnetic head according to claim 9, wherein:
    the magnetoresistance effect film extends in a direction from the first magnetic shield to the second magnetic shield; and
    the antiferromagnetic film is disposed near a portion in which the other of the first magnetic film and the second magnetic film extends.

11. A magnetic recording and reproducing apparatus comprising:
    a magnetic recording medium;
    the magnetic head according to claim 5;
    a movement controller that controls movements of the magnetic recording medium and the magnetic head so that they face each other and move relative to each other in a floating state or contacting state;
    a position controller that controls a position of the magnetic head to be at a predetermined recording position of the magnetic recording medium; and
    a signal processing unit that processes a write signal to the magnetic recording medium and a read signal from the magnetic recording medium using the magnetic head.

12. A magnetic recording and reproducing apparatus comprising:
    a magnetic recording medium;
    the magnetic head according to claim 8;
    a movement controller that controls movements of the magnetic recording medium and the magnetic head so that they face each other and move relative to each other in a floating state or contacting state;
    a position controller that controls a position of the magnetic head to be at a predetermined recording position of the magnetic recording medium; and
    a signal processing unit that processes a write signal to the magnetic recording medium and a read signal from the magnetic recording medium using the magnetic head.

* * * * *